(12) United States Patent
Wu et al.

(10) Patent No.: US 8,477,299 B2
(45) Date of Patent: Jul. 2, 2013

(54) METHOD AND APPARATUS FOR MONITORING MASK PROCESS IMPACT ON LITHOGRAPHY PERFORMANCE

(75) Inventors: Ping Chieh Wu, Shulin (TW); Chien-Hsun Chen, Hsinchu (TW); Ru-Gun Liu, Hsinchu (TW); Wen-Chun Huang, Xi-Gang Xiang (TW); Chih-Ming Lai, Hsinchu (TW); Boren Luo, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 522 days.

(21) Appl. No.: 12/752,488

(22) Filed: Apr. 1, 2010

(65) Prior Publication Data

US 2011/0243424 A1    Oct. 6, 2011

(51) Int. Cl.
*G01B 11/26* (2006.01)
*G01C 1/00* (2006.01)
*G01C 1/10* (2006.01)

(52) U.S. Cl.
USPC ............................ 356/144; 356/138; 356/148

(58) Field of Classification Search
USPC ............................................... 382/141–152
See application file for complete search history.

(56) References Cited

U.S. PATENT DOCUMENTS

| | | | | |
|---|---|---|---|---|
| 6,757,645 B2 * | 6/2004 | Chang et al. | | 703/13 |
| 6,810,296 B2 * | 10/2004 | Bode et al. | | 700/110 |
| 6,828,542 B2 * | 12/2004 | Ye et al. | | 250/208.1 |
| 6,917,849 B1 * | 7/2005 | Pasadyn et al. | | 700/121 |
| 6,968,253 B2 * | 11/2005 | Mack et al. | | 700/121 |
| 6,980,873 B2 * | 12/2005 | Shen | | 700/108 |
| 7,120,285 B1 * | 10/2006 | Spence | | 382/144 |
| 7,149,340 B2 * | 12/2006 | Filseth et al. | | 382/144 |
| 7,439,001 B2 * | 10/2008 | Ausschnitt et al. | | 430/30 |
| 8,037,429 B2 * | 10/2011 | Shang et al. | | 716/53 |
| 8,056,028 B2 * | 11/2011 | Cao et al. | | 716/55 |

* cited by examiner

*Primary Examiner* — Gregory J Toatley
*Assistant Examiner* — Jarreas C Underwood
(74) *Attorney, Agent, or Firm* — Hayne and Boone, LLP

(57) ABSTRACT

The present disclosure is directed generally to a method and apparatus for monitoring mask process impact on lithography performance. A method including receiving a physical wafer pattern according to a mask, extracting a mask contour from the mask, and extracting a deconvolution pattern based on the mask contour. A lithography process is simulated to create a virtual wafer pattern based on the deconvolution pattern. The virtual wafer pattern is then compared to the physical wafer pattern.

20 Claims, 4 Drawing Sheets

METHOD AND APPARATUS FOR MONITORING MASK PROCESS IMPACT ON LITHOGRAPHY PERFORMANCE

BACKGROUND

Embodiments of this disclosure relate generally to semiconductor inspection tools, and more particularly to an inspection algorithm and method for determining mask making quality. Embodiments of this disclosure use a deconvolution algorithm to inspect mask quality by reversing the SEM contours of a mask to polygons of an IC design layout.

In one conventional integrated circuit (IC) inspection model, a post-optical proximity correction (OPC) design pattern is input into a production model that implements a mask process model and a lithography process model to produce a simulated wafer pattern. It may be desirable in certain situations to simulate production of a wafer based on a mask contour generated from the design pattern (e.g., to determine whether a defect in a physical wafer is caused by a masking process). However, a mask contour pattern is not a suitable input to the foregoing production model, because the production model usually lumps the mask process with the lithography process since only wafer data is used during the model calibration. Accordingly, applying certain mask process parameters, such as mask corner rounding, to a mask contour input will generally result in a virtual wafer pattern that exhibits critical dimension (CD) variations due to double counting the mask process effect on the mask contour pattern.

In another embodiment of a conventional IC inspection model, a mask contour pattern is input into a production model that only has a lithography process model. Such a production model may be referred to as a "mask effect-less model" (MELM). However, MELM models require increased calibration efforts. Furthermore, MELM models may not accurately simulate real-world results, particularly because conventional lithography process models cannot assure model accuracy when provided with the irregular (i.e., non-polygon) shapes present in a mask contour pattern. Accordingly MELM models generally produce less accurate simulations of physical production results as compared to production models that include both a mask process model and a lithography process model.

Thus, there is a need for a method, system, and software for IC inspection that enables enhanced mask inspection, and failure mode analysis.

SUMMARY

The present disclosure is directed generally to a method and apparatus for monitoring mask process impact on lithography performance. In one embodiment, the present disclosure describes a method including receiving a physical wafer pattern according to a mask, extracting a mask contour from the mask, and extracting a deconvolution pattern based on the mask contour. A lithography process is simulated to create a virtual wafer pattern based on the deconvolution pattern. The virtual wafer pattern is then compared to the physical wafer pattern.

In another embodiment, a method includes extracting a mask contour from a mask layout and extracting a deconvolution pattern based on the mask contour. The deconvolution pattern is analyzed and a failure mode analysis is performed.

The present disclosure also describes an apparatus having a computer-readable medium. The computer-readable medium includes instructions executable by a processor, including instructions that extract a mask contour from a mask based on a design pattern; instructions that extract a deconvolution pattern based on the mask contour; and instructions that simulate a mask process to create a virtual mask contour based on the deconvolution pattern The computer-readable medium further includes instructions that simulate a lithography process to create a virtual wafer pattern based on the virtual mask contour; instructions for receiving a physical wafer pattern, wherein the physical wafer pattern is from a wafer that has been processed using the mask and a fabrication process; and instructions that compare the virtual wafer pattern and the physical wafer pattern for failure analysis.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

Figure 1:
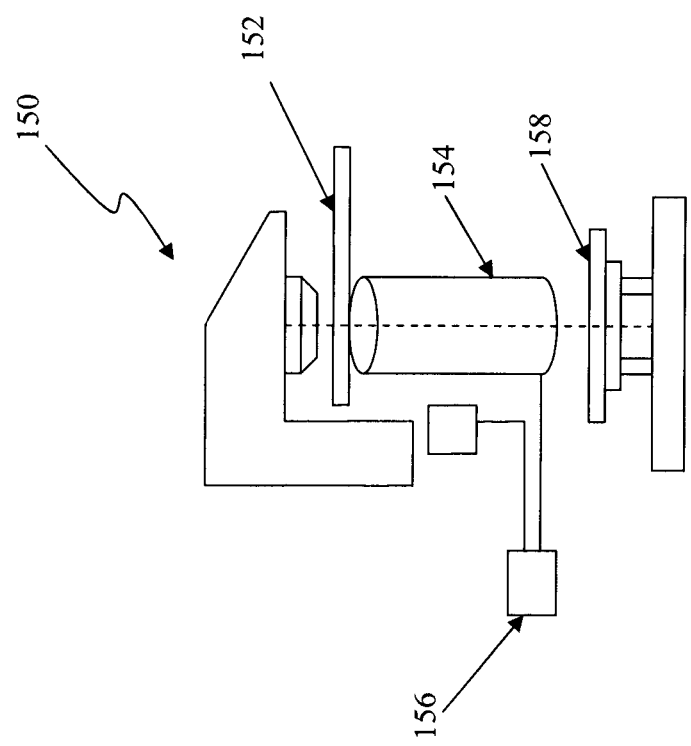
FIG. 1 is a schematic diagram illustrating a lithography apparatus according to aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a representative lithography apparatus 150 that is adapted to implement a physical lithography process. The lithography apparatus 150 includes a reticle 152, a projection lens 154, an alignment laser source 156, and a wafer stage 158. A design pattern may be implemented within the reticle 152, and then projected onto a wafer during exposure. Upon exposure, a physical wafer pattern is created.

Figure 2:
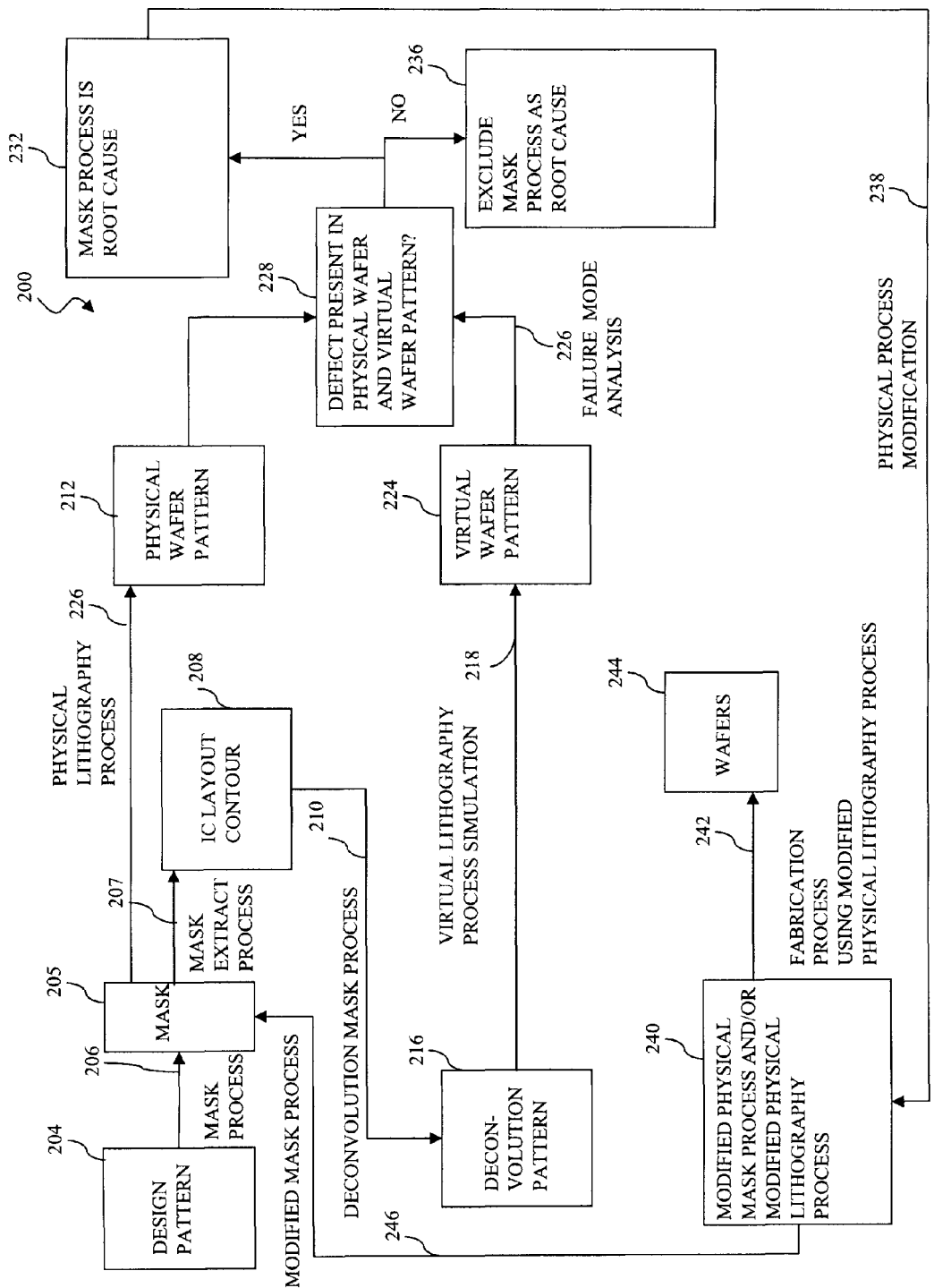
FIG. 2 is a flowchart illustrating an IC method according to aspects of the present disclosure.

Referring now to FIG. 2, shown is a flowchart of an IC method 200. The IC method 200 begins at block 204 by providing a design pattern of an IC device. The IC device is discussed herein as an example to illustrate the inspection method 200. In an example, the IC device includes a MOSFET device. The design pattern is a post-optical proximity correction (OPC) design pattern. However, in other embodiments, the design pattern may be any virtual or physical design pattern.

A mask based on the design pattern provided at block 204 is created at block 205 using a mask process 206. The mask process 206 is any mask process known in the art. The IC method 200 proceeds to block 208 by generating an IC layout contour based on the mask created at block 205. The IC layout contour is extracted via a mask extraction process 207 implemented by a mask contour apparatus. For example, the mask contour apparatus may include a scanning electron microscope (SEM) adapted to capture SEM images of a mask. In other embodiments, various wafer scanning systems other than an SEM may be used. For example, an optical microscope system, a scanning probe microscope system, a laser microscope system, a transmission electron microscope system, a focus ion beam microscope system, or other suitable optical imaging systems may be used instead of an SEM to create the IC layout contour. Furthermore, the mask extraction process 207 may include using data from the SEM images to create a mask SEM contour. As an example, an edge detector may be used to generate the IC layout contour. In other embodiments, the IC layout contour may be any physical IC layout contour that provides a representation of a mask contour.

At block 212, a wafer (or a physical wafer pattern) is produced by a wafer process 226 using the mask. The wafer process includes a lithography process (or physical lithography process to be differentiated from a virtual lithography process). In one embodiment, the wafer process includes a lithography process and an etching process to form a patterned material layer on the wafer. The physical wafer pattern may be produced using any suitable wafer process known in the art. The physical wafer pattern that is produced at block 212 is used in another portion of the IC method 200 described below.

The IC method 200 also proceeds to block 216 from block 208. At block 216, a deconvolution pattern is extracted from the IC mask contour by performing a deconvolution mask process 210. The deconvolution mask process 210 includes deriving the deconvolution pattern using data that represents the IC mask contour produced at block 208. For example, the deconvolution mask algorithm reverses the SEM contours of the mask SEM contour to obtain the deconvolution mask pattern. The deconvolution mask pattern should include substantially the same polygons present in the original design pattern provided in block 204. Conventional methods of IC inspection do not apply a deconvolution theorem to a mask SEM contour to obtain a deconvolution pattern as taught herein. Conventional mask inspection methods use measured or simulated mask SEM contours directly and compared these SEM contours with the original designed IC layout to check hot spot during the mask making process.

In an embodiment, the IC method 200 proceeds the deconvolution process on the mask SEM contour at block 126. Mask SEM contours are obtained by convolving the E-beam writing process with the designed IC layout. The deconvolution algorithm separate the effects of E-beam writing process from the mask SEM contour and obtain the deconvolution pattern which should be kept the same geometry if there are no changes during the mask making process and the original designed layout. Failure mode analysis can be applied when the geometry of deconvolution pattern exceed the mask making tolerance. The deconvolution algorithm uses the original IC layout as the initial guess and change the geometry of the mask pattern during numerical iterations. The final deconvoluton mask pattern will be obtained once the optimization is reached between the simulation and measured mask SEM contours.

At block 224, the IC method 200 produces a virtual wafer pattern. A virtual wafer is obtained by performing a virtual lithography process simulation 218. The lithography process simulator imports the deconvolution mask pattern and generate the simulated resist image on the wafer layout via using the production lithography model. The production lithography model is usually a kind of lumped process model that includes the process effect both for mask making and resist development. The resist image of the virtual wafer pattern can be obtained by convolving the lithography model with polygons on the deconvolution mask pattern.

The IC method 200 proceeds to block 228, where failure mode analysis is performed using the physical wafer pattern generated at block 212 and the virtual wafer pattern created at block 224. The failure mode analysis performed at block 228 includes determining whether a defect exists in both the physical and virtual wafer patterns. A defect includes variations in CD and/or spacing represented in both the physical and virtual wafer patterns. If the defect is present in both the physical and the virtual wafer patterns, then the mask process 206 is identified as the root cause of the defect, as determined at block 232. However, if the defect is not present in both the physical and the virtual wafer patterns, then this confirms that the mask process 206 is not the root cause of the defect, as determined at block 236.

A pattern-matching analyzer and/or a lithography process analyzer may be used as part of the failure mode analysis 226 to compare the physical and virtual wafer patterns. For example, the pattern matching analyzer may compare the critical dimensions (CD) and/or spacing of features present in the physical and virtual wafer patterns to determine whether a defect is present in both the virtual and the physical wafer patterns. The lithography process analyzer simulates the virtual wafer patterns of the deconvoluted design pattern from real mask contour patterns. Since it uses the real production model to do the simulation. If the defect is present, it indicates this mask contour shape can induce it. Therefore, the pattern-matching analyzer aims to be able to identify those patterns that are out of the user-defined tolerance of wafer CD and/or spacing criteria. This means that this pattern matching is not a pattern shape matching, but just one kind of specific pattern characteristic. In other words, this kind of pattern characteristics identifying approach should be achieved more efficiently.

In an embodiment, the pattern matching analyzer may calculate a quality index based upon the CD and/or spacing of features present in the original design pattern provided at block 204 and the deconvolution pattern obtained at block 216. The quality index may then be used to evaluate the quality of the mask process. Since the deconvolution pattern and the original IC design pattern should have similar pattern geometries, it is easier for a pattern-matching analyzer to identify defects that are common among the deconvolution pattern and the original design pattern.

If a kind of pattern is defined as a defect, it indicates that a portion of this pattern's CD or/and spacing is out of the specifications. Therefore, the quality indexes are usually defined for those locations. For example, it can be defined as the CD and/or spacing deviation percentage.

In yet another embodiment of the present disclosure, the design pattern provided at block 204 may be provided as an input to a virtual mask process simulation in order to generate a golden mask contour sample. This type of golden mask shape may assist to define the criteria or limitation of a real mask shape. If there is a golden mask sample, it can directly compare the mask contour pattern with this golden mask sample and, based on a predefined criteria of a mask shape, classify whether this real mask shape would induce defects or not. As such, this kind of mask shape comparison approach should be an efficient approach. In other words, because this only needs the pattern comparison or pattern matching, it may be the more efficient approach when compared to a more complicated lithography process simulation.

According to another embodiment of the present disclosure, the mask extraction process 207 may be replaced with another virtual mask process simulation to generate a second virtual mask contour rather than a physical mask contour. It may be desirable to do this so that the second virtual mask contour may be compared to a virtual mask contour to determine the quality of a virtual mask process simulation. Furthermore, in another embodiment, the physical lithography process 226 may be replaced with another virtual lithography process simulation to simulate another virtual wafer pattern. This may be helpful in comparing virtual wafer patterns to determine the quality of virtual lithography process simulations.

The method 200 also includes a physical process modification 238 that results in a modified mask process and/or a modified physical lithography process at block 240. A fabrication process using the modified physical lithography process 242 is used to create a plurality of wafers, as shown at block 244. Furthermore, the modified mask process 246 is carried out to produce a new mask, and portions of method 200 may be repeated as shown in FIG. 2.

Portions of the method 200 can be implemented in a computer system having a microprocessor, an input device, a storage device, a display, and a communication device all interconnected by one or more buses. For example, a virtual mask process simulation, the deconvolution mask process 210, the virtual lithography process simulation 218, and the failure mode analysis 226 may be implemented as software, and executed using hardware.

Figure 3:
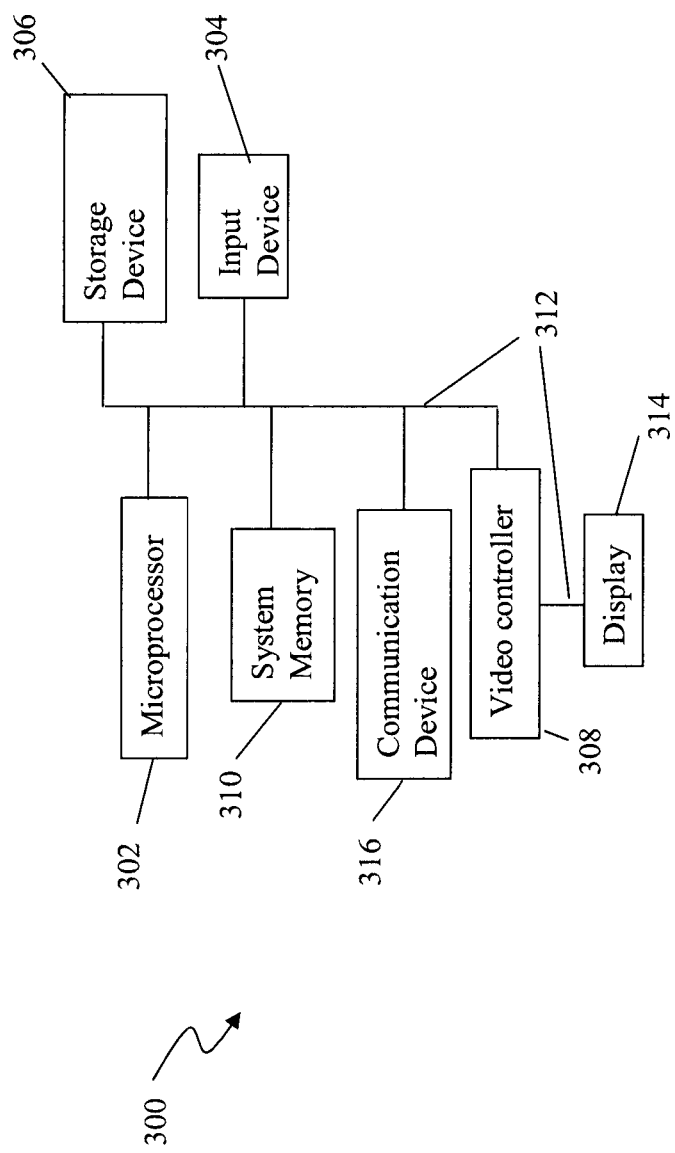
FIG. 3 is a schematic diagram illustrating a representative computer according to aspects of the present disclosure.

Referring now to FIG. 3, shown therein is an illustrative computer system 300 for implementing embodiments of the methods described above. Computer system 300 includes a microprocessor 302, an input device 304, a storage device 306, a video controller 308, a system memory 310, a display 314, and a communication device 316 all interconnected by one or more buses 312.

The storage device 306 could be a floppy drive, hard drive, CD-ROM, optical drive, or any other form of storage device. In addition, the storage device 306 may be capable of receiving a floppy disk, CD-ROM, DVD-ROM, or any other form of computer-readable medium that may contain computer-executable instructions.

Further communication device 316 could be a modem, network card, or any other device to enable the computer system to communicate with other nodes. It is understood that any computer system could represent a plurality of interconnected (whether by intranet or Internet) computer systems, including without limitation, personal computers, mainframes, PDAs, and cell phones.

A computer system typically includes at least hardware capable of executing machine readable instructions, as well as the software for executing acts (typically machine-readable instructions) that produce a desired result. In addition, a computer system may include hybrids of hardware and software, as well as computer sub-systems.

Hardware generally includes at least processor-capable platforms, such as client-machines (also known as personal computers or servers), and hand-held processing devices (such as smart phones, personal digital assistants (PDAs), or personal computing devices (PCDs), for example). Further, hardware may include any physical device that is capable of storing machine-readable instructions, such as memory or other data storage devices. Other forms of hardware include hardware sub-systems, including transfer devices such as modems, modem cards, ports, and port cards, for example.

Software includes any instructions stored in any computer-readable medium, including without limitation RAM or ROM, and instructions stored on other devices (such as floppy disks, flash memory, or a CD ROM, for example). Software may include source or object code, for example. In addition, software encompasses any set of instructions capable of being executed in a client machine or server.

Combinations of software and hardware could also be used for providing enhanced functionality and performance for certain embodiments of the present disclosure. One example is to directly manufacture software functions into a silicon chip. Accordingly, it should be understood that combinations of hardware and software are also included within the definition of a computer system and are thus envisioned by the present disclosure as possible equivalent structures and equivalent methods.

Computer-readable mediums include passive data storage, such as a random access memory (RAM) as well as semi-permanent data storage such as a compact disk read only memory (CD-ROM). In addition, an embodiment of the present disclosure may be embodied in the RAM of a computer to transform a standard computer into a new specific computing machine.

The computer system 300 may be designed to work on any specific architecture. For example, the system may be executed on a single computer, local area networks, client-server networks, wide area networks, internets, hand-held and other portable and wireless devices and networks.

Figure 4:
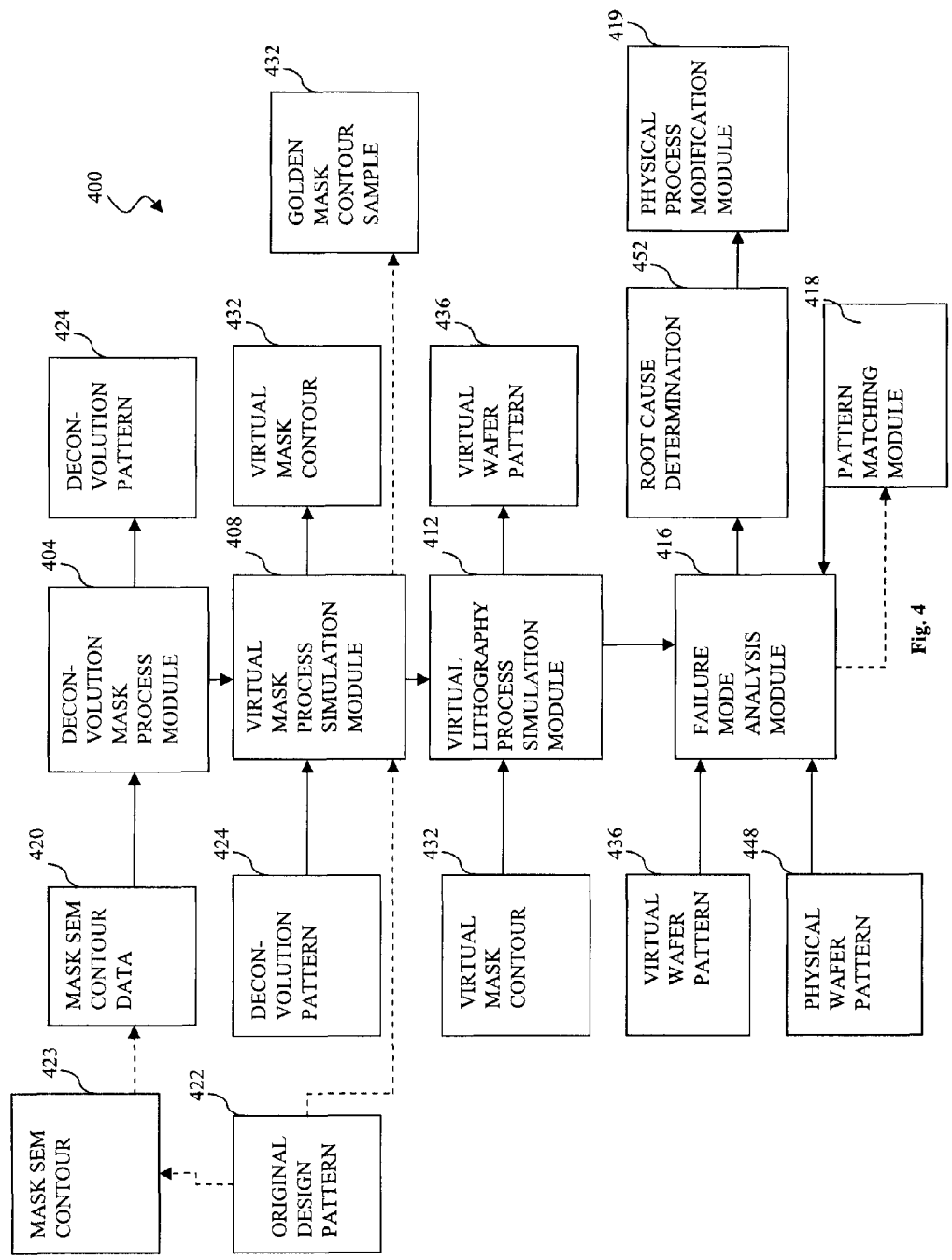
FIG. 4 is a schematic diagram illustrating representative software according to aspects of the present disclosure.

Referring now to FIG. 4, with continued reference to FIGS. 2 and 3, an embodiment of software 400 that implements portions of the method 200 is illustrated. The software 400 is installed on the storage device 306, and is executable by the microprocessor 302. Data generated and used by the software 400 may be stored partially in the system memory 310, and output is provided to the display 314 via the video controller 308. The software 400 includes the following modules: deconvolution mask process module 404, virtual mask process simulation module 408, virtual lithography process simulation module 412, failure mode analysis module 416, pattern matching module 418, and physical process modification module 419. The foregoing modules 404, 408, 412, 416, 418, and 419 are executed in the same order as set forth above. However, in other embodiments, the foregoing modules 404, 408, 412, 416, 418, and 419 may be executed in a different order, or only a portion of the foregoing modules 404, 408, 412, 416, 418, and 419 may be executed, provided that the inputs to the modules 404, 408, 412, 416, 418, and 419 are provided by other sources.

The deconvolution mask process module 420 takes mask SEM contour data 420 as an input, and outputs a deconvolution pattern 116. The mask SEM contour data 420 is extracted from the mask SEM contour obtained at block 208 of the method 200 shown in FIG. 2. As shown in FIG. 4, the mask SEM contour data may be extracted from a mask SEM contour 423 generated from an original design pattern 422. A function of the deconvolution mask process module 404 is to implement the deconvolution mask process 210 discussed above with respect to FIG. 2.

The deconvolution pattern 424 is an input to the virtual mask process simulation module 408. Upon receiving the deconvolution pattern 424, the virtual mask process simulation module 408 executes a virtual mask process simulation. A virtual mask contour 432 is an output of the virtual mask process simulation module.

The virtual mask contour 432 is provided as an input to the virtual lithography process simulation module 412. A function of the virtual lithography process simulation module includes executing the virtual lithography process simulation 218 of method 200 shown in FIG. 2. Upon executing the virtual lithography process simulation 218 using the virtual mask contour 432, the virtual lithography process simulation module 412 outputs a virtual wafer pattern 436, such as the virtual wafer pattern created in block 224 of the method 200 shown in FIG. 2.

The virtual wafer pattern 436 is provided as input to the failure mode analysis module 416 along with a physical wafer pattern 448. The physical wafer pattern 448 is patterned on a wafer using the mask (e.g., the physical wafer pattern obtained in block 212 of the method 200 shown in FIG. 2). Upon receiving the virtual wafer pattern 436 and the physical wafer pattern 448, the failure mode analysis module 416 implements the failure mode analysis 226 discussed above with respect to method 200 illustrated in FIG. 2. The failure mode analysis module 416 outputs a root cause determination 452.

As discussed above, the failure mode analysis 226 of method 200 shown in FIG. 2 may include determining whether a defect is represented in both the virtual wafer pattern 436 and the physical wafer pattern 448. The root cause determination 452 includes identifying the mask process 206 as the root cause if the defect is present in both the virtual wafer pattern 436 and the physical wafer pattern 448. Alternatively, the root cause determination 452 includes excluding the mask process 206 as the root cause if the defect is not present in both the virtual wafer pattern 436 and the physical wafer pattern 448.

The root cause determination 452 is provided as an input to the physical process modification 419. The physical process modification module 419 provides modifications to the physical processes (e.g., mask process 206 or physical lithography process 226) based on the root cause determination 452. The modified physical processes are then used to fabricate a plurality of wafers 244, as discussed above with respect to the fabrication process using modified physical processes 242 shown in FIG. 2.

In an embodiment, the failure mode analysis module 416 may include instructions that use a pattern-matching module 418 to compare a first CD of a first feature represented in the virtual wafer pattern 436 to a second CD of a second feature represented in the physical wafer pattern 448. The failure mode analysis module 416 may also include instructions that calculate a quality index based upon a difference between the first CD and the second CD of the second feature. In another embodiment, the virtual mask simulation module 408 may include instructions that simulate a mask process to create a golden mask contour sample 432 based on the original design pattern 422.

Thus, embodiments of the present disclosure, as compared to conventional IC methods, provide a more direct procedure for inspecting mask layout quality, and also require less effort during the process of pattern matching as a result of the similarity of the pattern geometries that are compared. Embodiments of the present disclosure may be used for inspecting mask error caused by imperfections during a masking process, including such processes involving complex design patterns (for both main patterns and assistant features). Furthermore, embodiments of the present disclosure may provide the large size of simulated mask contours directly and overcomes the limitation of field of view for SEM images by convolving the mask process model with the designed mask layout.

One of several advantages of some embodiments of the present disclosure over conventional methods of IC inspection is that simulated mask contours can be used to establish a mask quality control index by comparing the contour difference between a virtual mask contour and a physical mask SEM contour. Another one of several advantages of embodiments of the present disclosure is that some embodiments enable the determination of line end shortening of a design pattern, especially with respect to assistant features that are used to enhance the resolution of main features.

Furthermore, layout complexity and diversity are unavoidable issues when applying inverse lithography technology (ILT) to enhance lithography resolution, and it is difficult to inspect the mask quality using conventional methods. Conventional methods of IC inspection do not adequately address these issues. However, some embodiments of the present disclosure can be used to inspect mask errors caused by imperfections during the mask process 206, including applications that include ILT.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
receiving a physical wafer pattern according to a mask;
extracting a mask contour from the mask;
extracting a deconvolution pattern based on the mask contour;
simulating a lithography process to create a virtual wafer pattern based on the deconvolution pattern; and
comparing the virtual wafer pattern and the physical wafer pattern.

2. The method of claim 1 wherein the comparing produces deviation data, the method further comprising:
providing the deviation data for failure mode analysis.

3. The method of claim 2, further comprising:
adjusting a fabrication process in response to the failure mode analysis.

4. The method of claim 2, wherein the failure mode analysis includes using a pattern-matching analyzer to compare a first critical dimension (CD) of a first feature present in the virtual wafer pattern to a second CD of a second feature present in the physical wafer pattern.

5. The method of claim 1, wherein the extracting the mask contour includes utilizing a scanning electron microscope (SEM).

6. The method of claim 2, wherein the failure mode analysis comprises:
determining that making the mask is a root cause of a defect if the defect is present in both the physical wafer pattern and the virtual wafer pattern.

7. The method of claim 6, further comprising:
producing a corrected mask in response to the failure mode analysis.

8. The method of claim 1, further comprising
calculating a quality index based upon a difference between a first critical dimension (CD) of a first feature present in the virtual wafer pattern and a second CD of a second feature present in the physical wafer pattern; and
wherein comparing the virtual wafer pattern and the physical wafer pattern includes comparing the calculated quality index with a second quality index.

9. The method of claim 1 further comprising:
creating a virtual mask based on the deconvolution pattern, whereby the simulating is performed using the virtual mask.

10. The method of claim 1, further comprising:
simulating a mask process to create a virtual mask contour based on the devolution pattern, and the simulating a lithography process to create a virtual wafer pattern includes simulating a lithography process based on the virtual mask contour.

11. The method of claim 1, further comprising:
simulating a second mask process to create an ideal mask contour sample based on the design pattern.

12. A method, comprising:
extracting a mask contour from a mask layout;
extracting a deconvolution pattern based on the mask contour;
analyzing the deconvolution pattern;
performing a failure mode analysis according to the analyzing;
receiving first pattern data from a physical device patterned according to the mask layout; and
receiving second pattern data from the deconvolution pattern;
wherein, analyzing the deconvolution pattern includes comparing the first pattern data from the second pattern data.

13. The method of claim 12, wherein the first pattern data is from a wafer that has been fabricated using a mask produced according to the mask layout.

14. The method of claim 12, wherein the second pattern data is from a virtual wafer that has been created a wafer process simulation using the deconvolution pattern.

15. The method of claim 12, wherein extracting a mask contour is performed using a scanning electron microscope (SEM) to examine a mask constructed according to the mask layout.

16. The method of claim 14, wherein the wafer process simulation includes performing a mask process simulation to create a virtual mask contour based on the deconvolution pattern, and performing a wafer process simulation to create a virtual wafer pattern based on the virtual mask contour.

17. An apparatus, having a computer-readable medium, the computer-readable medium having instructions executable by a processor, comprising:
instructions that extract a mask contour from a mask based on a design pattern;
instructions that extract a deconvolution pattern based on the mask contour;
instructions that simulate a mask process to create a virtual mask contour based on the deconvolution pattern;
instructions that simulate a lithography process to create a virtual wafer pattern based on the virtual mask contour;
instructions for receiving a physical wafer pattern, wherein the physical wafer pattern is from a wafer that has been processed using the mask and a fabrication process; and
instructions that compare the virtual wafer pattern and the physical wafer pattern for failure analysis.

18. The apparatus of claim 17, wherein the instructions further comprise:
instructions that fix a failure identified from the failure analysis, wherein the failure is related to one of a mask process to make the mask or a wafer process to generate the physical wafer pattern.

19. The apparatus of claim 17, wherein the instructions that perform the failure analysis comprise instructions that determine that a mask process to make the mask is a root cause of a defect if the defect is present in both the physical wafer pattern and the virtual wafer pattern.

20. The method of claim 1, further comprising determining whether a mask process to make the mask is a cause of a defect in the physical wafer pattern based on the comparison of the virtual wafer pattern and the physical wafer pattern.

* * * * *